(12) United States Patent
Fukuda et al.

(10) Patent No.: US 10,094,884 B2
(45) Date of Patent: Oct. 9, 2018

(54) SENSOR INCLUDING A POLYMER MATRIX FOR MONITORING SEALED SECONDARY BATTERY, SEALED SECONDARY BATTERY INCLUDING THE MONITORING SENSOR, AND METHOD FOR MONITORING SEALED SECONDARY BATTERY

(71) Applicant: TOYO TIRE & RUBBER CO., LTD., Osaka-shi, Osaka (JP)

(72) Inventors: Takeshi Fukuda, Osaka (JP); Toshiaki Kawai, Osaka (JP)

(73) Assignee: TOYO TIRE & RUBBER CO., LTD., Itami-shi (JP)

( * ) Notice: Subject to any disclaimer, the term of this patent is extended or adjusted under 35 U.S.C. 154(b) by 0 days.

(21) Appl. No.: 15/509,969

(22) PCT Filed: Nov. 12, 2015

(86) PCT No.: PCT/JP2015/081881
§ 371 (c)(1),
(2) Date: Mar. 9, 2017

(87) PCT Pub. No.: WO2016/084620
PCT Pub. Date: Jun. 2, 2016

(65) Prior Publication Data
US 2017/0299659 A1    Oct. 19, 2017

(30) Foreign Application Priority Data
Nov. 26, 2014  (JP) ................ 2014-238902

(51) Int. Cl.
*G01R 31/36* (2006.01)
*G01B 7/24* (2006.01)

(52) U.S. Cl.
CPC ........... *G01R 31/3679* (2013.01); *G01B 7/24* (2013.01)

(58) Field of Classification Search
CPC ..... G01B 7/24; G01R 31/3679; H01M 10/48; H01M 10/04; H01M 2/02; Y02E 60/122
See application file for complete search history.

(56) References Cited

U.S. PATENT DOCUMENTS

| 4,825,181 A | 4/1989 | Nagano et al. |
| 2001/0038940 A1 | 11/2001 | Okumura et al. |

(Continued)

FOREIGN PATENT DOCUMENTS

| DE | 4041962 A1 * | 6/1992 | ............. H01F 1/113 |
| JP | 53-128842 U | 10/1978 | |

(Continued)

OTHER PUBLICATIONS

Notification of Transmittal of Translation of the International Preliminary Report on Patentability (Form PCT/IB/338) issued in counterpart International Application No. PCT/JP2015/081881 dated Jun. 8, 2017, with Forms PCT/IB/373 and PCT/ISA/237. (8 pages).

(Continued)

*Primary Examiner* — Jay Patidar
(74) *Attorney, Agent, or Firm* — Westerman, Hattori, Daniels & Adrian, LLP

(57) ABSTRACT

This monitoring sensor is provided with polymer matrix layers 3 containing a magnetic filler and attached to an outer casing or an electrode group, and a magnetism detection unit 4 for detecting a change in magnetism. The magnetic filler is magnetized in the in-plane direction of the polymer matrix layers 3. An interface layer 5 is formed between the polymer matrix layers 3 that are arranged with edges thereof facing each other. The directions of magnetization of the magnetic filler on one side and the other side having the interface layer 5 interposed therebetween are opposite to each other and intersect with the interface layer 5 as viewed in the thickness direction of the polymer matrix layers 3. The magnetism detection unit 4 is disposed on a straight line L1 passing (Continued)

through the interface layer 5 and extending in the thickness direction of the polymer matrix layers 3.

9 Claims, 8 Drawing Sheets

(56) References Cited

U.S. PATENT DOCUMENTS

| | | | |
|---|---|---|---|
| 2006/0010992 A1 | 1/2006 | Shima et al. | |
| 2009/0246607 A1 | 10/2009 | Shinyashiki et al. | |
| 2015/0253207 A1* | 9/2015 | Shigeto .................... | G01B 7/24 73/862.625 |

FOREIGN PATENT DOCUMENTS

| | | | |
|---|---|---|---|
| JP | 63-232230 A | | 9/1988 |
| JP | 2001-345123 A | | 12/2001 |
| JP | 2002-289265 A | | 10/2002 |
| JP | 2004-170300 A | | 6/2004 |
| JP | 2004-331038 A | | 11/2004 |
| JP | 2006-12504 A | | 1/2006 |
| JP | 2008-234840 A | | 10/2008 |
| JP | 2009-245879 A | | 10/2009 |
| JP | 2014-98687 A | | 5/2014 |
| JP | 2014098688 A | * | 5/2014 |

OTHER PUBLICATIONS

International Search Report dated Feb. 16, 2016, issued in counterpart application No. PCT/JP2015/081881. (2 pages).
Office Action dated Sep. 5, 2017, issued in counterpart Japanese Application No. 2014-238902, with English translation. (6 pages).
Office Action dated Apr. 3, 2018, issued in counterpart Japanese Application No. 2014-238902, with English translation. (4 pages).
Office Action dated Apr. 19, 2018, issued in counterpart Korean application No. 10-2017-7012526, with English translation. (15 pages).

* cited by examiner

Distance from center(mm)

SENSOR INCLUDING A POLYMER MATRIX FOR MONITORING SEALED SECONDARY BATTERY, SEALED SECONDARY BATTERY INCLUDING THE MONITORING SENSOR, AND METHOD FOR MONITORING SEALED SECONDARY BATTERY

TECHNICAL FIELD

The present invention relates to a monitoring sensor for monitoring a sealed secondary battery, a sealed secondary battery on which the monitoring sensor is mounted, and a method for monitoring the sealed secondary battery.

BACKGROUND ART

In recent years, a sealed secondary battery (which may be hereinafter simply referred to as "secondary battery") represented by a lithium ion secondary battery is used as a power source not only for a mobile apparatus such as a portable phone or a notebook personal computer but also for an electrically driven vehicle such as an electric automobile or a hybrid car. A cell constituting the secondary battery has a structure in which an electrode group is accommodated in an inside of a sealed outer casing, and the electrode group is constructed by winding or stacking a positive electrode and a negative electrode with a separator interposed therebetween. For example, a laminate film such as an aluminum laminate foil is used as the outer casing. Typically, a laminate film such as an aluminum laminate foil or a metal can having a cylindrical shape or a rectangular prismatic shape is used as the outer casing.

The secondary battery has a problem that, when the electrolytic solution is decomposed due to overcharging or the like, the cell swells to be deformed in accordance with rise in the internal pressure caused by the decomposition gas and, unless the charging current or the discharging current is stopped, this results in rupture of the secondary battery. Conventionally, a safety valve that is released by an internal pressure of a predetermined level or higher (for example, about 1 MPa to 2 MPa) is provided. However, the electrolytic solution is scattered to contaminate the surroundings when the safety valve is released, so that a technique capable of preventing the rupture without depending on the safety valve is desired. Also, though the danger of reaching the rupture is low in a secondary battery of an aluminum laminate film type, there is a fear that an electric apparatus or module on which the secondary battery is mounted may be broken by swelling of the cells. Due to such circumstances, there is a demand for monitoring the deformation of the secondary battery, and a technique capable of detecting the deformation with a high degree of sensitivity is needed.

Patent Document 1 discloses a monitoring apparatus in which a pressure sensor is disposed in an inside space of a safety valve of a lithium secondary battery, and the pressure detected by the sensor is displayed on a displaying device. However, this necessitates an electric wire from the pressure sensor located in the inside of the container to the displaying device located on the outside of the container. Therefore, unless a structure for sealing the surroundings of the electric wire is added, the sealed structure is hindered. Also, Patent Document 2 discloses a sealed storage battery including a pressure-sensitive electroconductive rubber that changes a resistance value thereof in accordance with rise in the internal pressure provided in a battery case. However, an electric wire from the inside to the outside of the battery case is provided, and a special structure for retaining the sealed structure is needed in the battery case.

Patent Document 3 discloses a laminate-type battery in which, in a part of a welded part in which the fringes of a laminate film are welded to each other, a part in which metal layers are in contact with each other without intervention of a resin layer is formed, and rise in the internal pressure is detected by change in the voltage value or change in the resistance value of the metal layer when that part is peeled off. However, in this battery, detection is not carried out unless the internal pressure becomes so high that the welded part is peeled off. Also, forming the part in which the resin layer is absent or the metal layer is exposed at the welded part can disadvantageously be a cause of breakdown.

Patent Document 4 discloses a tactile sensor provided with an elastomer containing a magnetic filler and a magnetism sensor that detects a change in magnetism caused by the deformation of the elastomer, and this is constructed as a pressure sensor that detects the pressure applied to the elastomer. However, it is assumed that this tactile sensor is applied to a hand or skin of a robot on which a comparatively large external force is applied, so that there may be cases in which the sensitivity is insufficient in monitoring the deformation of the sealed secondary battery such as described above. For practical use, in order to monitor the deformation of the sealed secondary battery, it is extremely important that the sensitivity of the detection is enhanced; however, a technique therefor is not disclosed.

PRIOR ART DOCUMENTS

Patent Documents

Patent Document 1: JP-A-2002-289265
Patent Document 2: JP-A-2001-345123
Patent Document 3: JP-A-2009-245879
Patent Document 4: JP-A-2014-98687

SUMMARY OF THE INVENTION

Problems to be Solved by the Invention

The present invention has been made in view of the aforementioned circumstances, and an object thereof is to provide a monitoring sensor for monitoring a sealed secondary battery, a sealed secondary battery, and a method for monitoring the sealed secondary battery that can detect the deformation with a high degree of sensitivity without hindering the sealed structure.

Means for Solving the Problems

The present invention provides a monitoring sensor for monitoring a sealed secondary battery in which an electrode group is accommodated in an inside of a sealed outer casing, the monitoring sensor comprising polymer matrix layers containing a magnetic filler and attached to the outer casing or the electrode group, and a magnetism detection unit for detecting a change in magnetism accompanying a deformation of the polymer matrix layers. Further, in the monitoring sensor for monitoring the sealed secondary battery according to the present invention, any one of the first to fourth modes described later may be adopted with respect to the direction of magnetization of the magnetic filler contained in the polymer matrix layer and the position of the magnetism detection unit relative to the polymer matrix layer.

In this monitoring sensor, when a deformation occurs in the outer casing or the electrode group of the secondary battery, the polymer matrix layer is deformed in accordance therewith, and the change in magnetism accompanying the deformation of the polymer matrix layer is detected by the magnetism detection unit. Because the secondary battery has a construction in which the change in magnetism is detected in this manner, there is no need to provide an electric wiring from the polymer matrix layer to the magnetism detection unit, and therefore, the sealed structure is not hindered. Moreover, by specifically adopting any one of the first to fourth modes with respect to the direction of magnetization of the magnetic filler and the position of the magnetism detection unit, the deformation of the secondary battery can be detected with a high degree of sensitivity.

According to the first mode, the magnetic filler is magnetized in an in-plane direction of the polymer matrix layers, an interface layer is formed between the polymer matrix layers that are arranged with edges thereof facing each other, directions of magnetization of the magnetic filler on one side and the other side having the interface layer interposed therebetween are opposite to each other and intersect with the interface layer as viewed in a thickness direction of the polymer matrix layers, and the magnetism detection unit is disposed on a straight line passing through the interface layer and extending in the thickness direction of the polymer matrix layers. In this construction, the magnetism detection unit is disposed at a position having a high magnetic flux density (having an intense magnetic field) for the polymer matrix layer where the interface layer such as described above is formed, so that the deformation of the secondary battery can be detected with a high degree of sensitivity.

According to the second mode, the magnetic filler is magnetized in a thickness direction of the polymer matrix layer, and the magnetism detection unit is disposed on a straight line passing through an edge of the polymer matrix layer and extending in the thickness direction of the polymer matrix layer. In this construction, the magnetism detection unit is disposed at a position having a high magnetic flux density (having an intense magnetic field) for the polymer matrix layer such as described above, so that the deformation of the secondary battery can be detected with a high degree of sensitivity.

According to the third mode, the magnetic filler is magnetized in a thickness direction of the polymer matrix layers, a gap is disposed between the polymer matrix layers that are arranged with edges thereof facing each other, directions of magnetization of the magnetic filler on one side and the other side having the gap interposed therebetween are the same as each other, and the magnetism detection unit is disposed on a straight line passing through the gap and extending in the thickness direction of the polymer matrix layers. In this construction, the magnetism detection unit is disposed at a position having a high magnetic flux density (having an intense magnetic field) for the polymer matrix layer where the gap such as described above is formed, so that the deformation of the secondary battery can be detected with a high degree of sensitivity.

According to the fourth mode, the magnetic filler is magnetized in a thickness direction of the polymer matrix layers, an interface layer is formed between the polymer matrix layers that are arranged with edges thereof facing each other, directions of magnetization of the magnetic filler on one side and the other side having the interface layer interposed therebetween are opposite to each other, and the magnetism detection unit is disposed on a straight line passing through the interface layer and extending in the thickness direction of the polymer matrix layers. In this construction, the magnetism detection unit is disposed at a position having a high magnetic flux density (having an intense magnetic field) for the polymer matrix layer where the interface layer such as described above is formed, so that the deformation of the secondary battery can be detected with a high degree of sensitivity.

The sealed secondary battery according to the present invention is a sealed secondary battery in which the above-described monitoring sensor is mounted. In this sealed secondary battery, when the outer casing or the electrode group is deformed, the polymer matrix layer is deformed in accordance therewith, and the change in magnetism accompanying the deformation of the polymer matrix layer is detected by the magnetism detection unit. Because the secondary battery has a construction in which the change in magnetism is detected in this manner, there is no need to provide an electric wiring from the polymer matrix layer to the magnetism detection unit, so that the sealed structure is not hindered. Moreover, by adopting any one of the first to fourth modes with respect to the direction of magnetization of the magnetic filler and the position of the magnetism detection unit, the deformation thereof can be detected with a high degree of sensitivity.

The method for monitoring a sealed secondary battery according to the present invention comprises detecting, by using the above-described monitoring sensor, a change in magnetism accompanying a deformation of the polymer matrix layer with the magnetism detection unit, and detecting a deformation of the sealed secondary battery on a basis thereof. According to this monitoring method, the deformation of the sealed secondary battery can be detected with a high degree of sensitivity without hindering the sealed structure of the secondary battery, as described above.

BRIEF DESCRIPTION OF THE DRAWINGS

FIG. 1(a) is a perspective view, and FIG. 1(b) is an A-A sectional view.

MODE FOR CARRYING OUT THE INVENTION

An embodiment of the present invention will be explained.

Figure 1A:
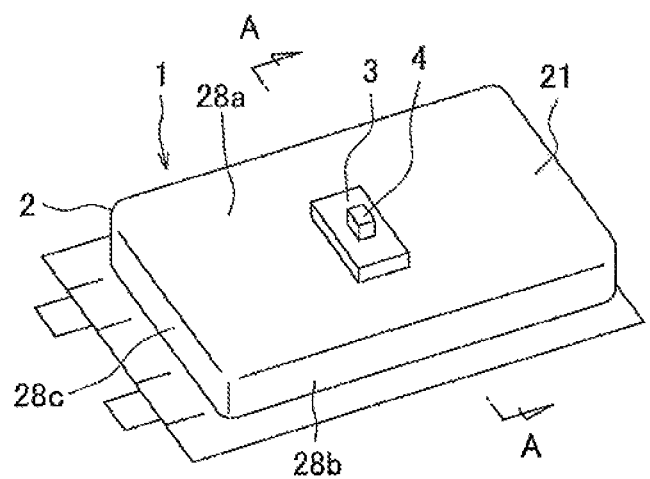
FIG. 1(a) and FIG. 1(b) show one example of a sealed secondary battery on which a monitoring sensor is mourned, where
Figure 1B:
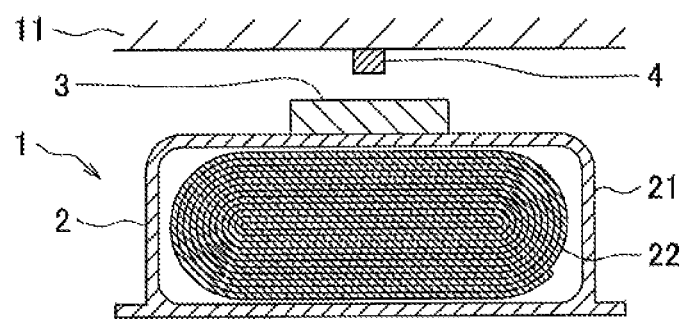

On a sealed secondary battery 1 shown in FIG. 1(a) and FIG. 1(b), a monitoring sensor including a polymer matrix layer 3 and a magnetism detection unit 4 is mounted. A cell 2 constituting this secondary battery 1 has a structure in which an electrode group 22 is accommodated in the inside of a sealed outer casing 21. The electrode group 22 is constructed by winding a positive electrode and a negative electrode with a separator interposed therebetween, and an electrolytic solution is held by the separator. In the present embodiment, a laminate film such as an aluminum laminate foil is used for the outer casing 21, and the electrode group 22 has a cylindrically wound structure.

The polymer matrix layer 3 contains a magnetic filler. The polymer matrix layer 3 is preferably a magnetic elastomer layer in which the magnetic filler is dispersed in a matrix that contains an elastomer component.

The magnetic filler may be, for example, a rare-earth-based, iron-based, cobalt-based, nickel-based, or oxide-based filler; however, a rare-earth-based filler is preferable because a higher magnetic force can be obtained. The shape of the magnetic filler is not particularly limited, so that the shape may be any one of spherical, flattened, needle-like, prismatic, and amorphous shapes. The average particle size of the magnetic filler is preferably from 0.02 to 500 μm, more preferably from 0.1 to 400 μm, and still more preferably from 0.5 to 300 μm. When the average particle size is smaller than 0.02 μm, the magnetic characteristics of the magnetic filler tend to deteriorate. On the other hand, when the average particle size exceeds 500 μm, the mechanical properties of the magnetic elastomer layer tend to deteriorate, and the magnetic elastomer layer tends to be brittle.

The magnetic filler may be introduced into the elastomer after magnetization; however, it is preferable to magnetize the magnetic filler after introduction into the elastomer. By magnetizing the magnetic filler after the magnetic filler is introduced into the elastomer, it will be easier to magnetize the magnetic filler in a desired direction, and this is convenient in enhancing the sensitivity of the monitoring sensor.

A thermoplastic elastomer, a thermosetting elastomer, or a mixture of these can be used as the elastomer component. Examples of the thermoplastic elastomer include a styrene-based thermoplastic elastomer, a polyolefin-based thermoplastic elastomer, a polyurethane-based thermoplastic elastomer, a polyester-based thermoplastic elastomer, a polyamide-based thermoplastic elastomer, a polybutadiene-based thermoplastic elastomer, a polyisoprene-based thermoplastic elastomer, and a fluororubber-based thermoplastic elastomer. Also, examples of the thermosetting elastomer include diene-based synthetic rubbers such as polyisoprene rubber, polybutadiene rubber, styrene-butadiene rubber, polychloroprene rubber, nitrile rubber, and ethylene-propylene rubber, non-diene-based synthetic rubbers such as ethylene-propylene rubber, butyl rubber, acrylic rubber, polyurethane rubber, fluororubber, silicone rubber, and epichlorohydrin rubber, and natural rubbers. Among these, a thermosetting elastomer is preferable, and this is because settling of the magnetic elastomer accompanying the heat generation or overloading of the battery can be suppressed. Further, a polyurethane rubber (which may also be referred to as a polyurethane elastomer) or a silicone rubber (which may also be referred to as a silicone elastomer) is more preferable.

A polyurethane elastomer can be obtained by reacting a polyol with a polyisocyanate. In the case in which the polyurethane elastomer is used as the elastomer component, a magnetic filler is mixed with a compound containing active hydrogen, and further an isocyanate component is added thereto to obtain a mixture liquid. Also, a mixture liquid can also be obtained by mixing a magnetic filler with an isocyanate component, and mixing a compound containing active hydrogen thereto. The magnetic elastomer can be produced by injecting the mixture liquid into a mold that has been subjected to a releasing treatment, and thereafter heating the mixture liquid up to a curing temperature for curing. Also, in the case in which a silicone elastomer is used as the elastomer component, the magnetic elastomer can be produced by putting a magnetic filler into a precursor of a silicone elastomer, mixing the components, putting the resulting mixture into a mold, and thereafter heating the mixture for curing. A solvent may be added as necessary.

A compound known in the art in the field of polyurethane can be used as the isocyanate component that can be used in the polyurethane elastomer. Examples of the isocyanate component include aromatic diisocyanates such as 2,4-toluene diisocyanate, 2,6-toluene diisocyanate, 2,2'-diphenylmethane diisocyanate, 2,4'-diphenylmethane diisocyanate, 4,4'-diphenylmethane diisocyanate, 1,5-naphthalene diisocyanate, p-phenylene diisocyanate, m-phenylene diisocyanate, p-xylylene diisocyanate, and m-xylylene diisocyanate, aliphatic diisocyanates such as ethylene diisocyanate, 2,2,4-trimethylhexamethylene diisocyanate, and 1,6-hexamethylene diisocyanate, and alicyclic diisocyanates such as 1,4-cyclohexane diisocyanate, 4,4'-dicyclohexylmethane diisocyanate, isophorone diisocyanate, and norbornane diisocyanate. These may be used either alone or as a mixture of two or more kinds. Also, the isocyanate component may be a modified component such as a urethane-modified, allophanate-modified, biuret-modified, or isocyanurate-modified component. Preferable isocyanate components are 2,4-toluene diisocyanate, 2,6-toluene diisocyanate, and 4,4'-diphenylmethane diisocyanate.

A compound typically used in the technical field of polyurethane can be used as the compound containing active hydrogen. Examples of the compound containing active hydrogen include high-molecular-weight polyols such as polyether polyols represented by polytetramethylene glycol, polypropylene glycol, polyethylene glycol, and a copolymer of propylene oxide and ethylene oxide, polyester polyols represented by polybutylene adipate, polyethylene adipate, and 3-methyl-1,5-pentane adipate, polyester polycarbonate polyols typified by reaction products of alkylene carbonate and polyester glycol such as polycaprolactone polyol or polycaprolactone glycol, polyester polycarbonate polyols obtained by reacting ethylene carbonate with a polyhydric alcohol and subsequently reacting the obtained reaction mixture with an organic dicarboxylic acid, and polycarbonate polyols obtained by transesterification reaction of a polyhydroxyl compound and aryl carbonate. These may be used either alone or as a mixture of two or more kinds.

In addition to the above-described high-molecular-weight polyol components, low-molecular-weight polyol components such as ethylene glycol, 1,2-propylene glycol, 1,3-propylene glycol, 1,4-butanediol, 1,6-hexanediol, neopentyl glycol, 1,4-cyclohexanedimethanol, 3-methyl-1,5-pentanediol, diethylene glycol, triethylene glycol, 1,4-bis(2-hydroxyethoxy)benzene, trimethylolpropane, glycerin, 1,2,6-hexanetriol, pentaerythritol, tetramethylolcyclohexane, methylglucoside, sorbitol, mannitol, dulcitol, sucrose, 2,2,6,6-tetrakis(hydroxymethyl)cyclohexanol, and triethanolamine, and low-molecular-weight polyamine components such as ethylenediamine, tolylenediamine, diphenylmethanediamine, and diethylenetriamine may be used as the compound containing active hydrogen. These may be used either alone or as a mixture of two or more kinds. Further, polyamines typified by 4,4'-methylenebis(o-chloroaniline) (MOCA), 2,6-dichloro-p-phenylenediamine, 4,4'-methylenebis(2,3-dichloroaniline), 3,5-bis(methylthio)-2,4-toluenediamine, 3,5-bis(methylthio)-2,6-toluenediamine, 3,5-diethyltoluene-2,4-diamine, 3,5-diethyltoluene-2,6-diamine, trimethyleneglycol-di-p-aminobenzoate, polytetramethyleneoxide-di-p-aminobenzoate, 1,2-bis(2-aminophenylthio)ethane, 4,4'-diamino-3,3'-diethyl-5,5'-dimethyldiphenylmethane, N,N'-di-sec-butyl-4,4'-diaminodiphenylmethane, 4,4'-diamino-3,3'-diethyldiphenylmethane, 4,4'-diamino-3,3'-diethyl-5,5'-dimethyldiphenylmethane, 4,4'-diamino-3,3'-diisopropyl-5,5'-dimethyldiphenylmethane, 4,4'-diamino-3,3',5,5'-tetraethyldiphenylmethane, 4,4'-diamino-3,3',5,5'-tetraisopropyldiphenylmethane, m-xylylenediamine, N,N'-di-sec-butyl-p-phenylenediamine, m-phenylenediamine, and p-xylylenediamine may also be mixed. Preferable compounds containing active hydrogen are polytetramethylene glycol, polypropylene glycol, a copolymer of propylene oxide and ethylene oxide, and a polyester polyol made of 3-methyl-1,5-pentanediol and adipic acid. More preferable compounds containing active hydrogen are polypropylene glycol and a copolymer of propylene oxide and ethylene oxide.

A preferable combination of the isocyanate component and the compound containing active hydrogen is a combination of one kind or two more kinds of 2,4-toluene diisocyanate, 2,6-toluene diisocyanate, and 4,4'-diphenylmethane diisocyanate as the isocyanate component and one kind or two more kinds of polytetramethylene glycol, polypropylene glycol, a copolymer of propylene oxide and ethylene oxide, and 3-methyl-1,5-pentane adipate as the compound containing active hydrogen. A more preferable combination is a combination of 2,4-toluene diisocyanate and/or 2,6-toluene diisocyanate as the isocyanate component and polypropylene glycol and/or a copolymer of propylene oxide and ethylene oxide as the compound containing active hydrogen.

A known catalyst can be used without limitation as the catalyst to be used in the polyurethane elastomer; however, a tertiary amine catalyst such as triethylenediamine (1,4-diazabicyclo[2,2,2]octane), N,N,N',N'-tetramethylhexanediamine, or bis(2-dimethylaminoethyl)ether is preferably used, and a metal catalyst such as tin octylate or lead octylate can also be used in combination.

Commercially available products of the catalysts include "TEDA-L33" manufactured by Tosoh Corporation, "NIAX CATALYST A1" manufactured by Momentive Performance Materials Inc., "KAOLIZER NO. 1" and "KAOLIZER NO. 30P" manufactured by Kao Corporation, "DABCO T-9" manufactured by Air Products and Chemicals, Inc., and "BTT-24" manufactured by Toei Chemical Industry Co., Ltd.

The amount of the magnetic filler in the magnetic elastomer is preferably 1 to 2000 parts by weight, more preferably 5 to 1500 parts by weight, relative to 100 parts by weight of the elastomer component. When the amount is smaller than 1 part by weight, detection of change in the magnetic field tends to be difficult. When the amount exceeds 2000 parts by weight, the magnetic elastomer itself may in some cases become brittle.

The elastic modulus of the polymer matrix layer 3 is preferably from 0.01 to 10 MPa, more preferably from 0.02 to 8 MPa, still more preferably from 0.03 to 6 MPa, and further more preferably from 0.05 to 5 MPa. When the elastic modulus is smaller than 0.01 MPa, the handling property of the polymer matrix layer 3 is deteriorated to make the handling difficult. Also, when the elastic modulus is larger than 10 MPa, the polymer matrix layer 3 becomes less likely to be deformed, so that the sensor sensitivity tends to decrease. A method for obtaining an elastic modulus within a range from 0.01 to 10 MPa may be, for example, addition of a plasticizer, addition of a monool component, or adjustment of an NCO index. The elastic modulus is a compressive elastic modulus as measured in accordance with JIS K-7312.

The polymer matrix layer 3 is formed in a sheet form, and the thickness thereof is preferably from 50 to 3000 µm, more preferably from 60 to 2000 µm, and still more preferably from 70 to 1500 µm. When the thickness is smaller than 50 µm, the polymer matrix layer 3 tends to become brittle when a required amount of the filler is added, thereby the handling property is deteriorated. On the other hand, when the thickness is larger than 3000 µm, it may in some cases become difficult to dispose the polymer matrix layer 3 in the inside of the outer casing 21 (for example, FIGS. 15 and 16), though this depends on the size of the inside space of the cell 2.

In the present embodiment, the polymer matrix layer 3 is attached to the outer casing 21. Specifically, the polymer matrix layer 3 is bonded to an outer surface of the outer casing 21. The outer casing 21 is formed in a thin rectangular parallelepiped shape as a whole and has a plurality of wall portions 28a to 28c. The polymer matrix layer 3 may be bonded to any one of the wall portions 28a to 28c. However, because the swelling of the cell 2 becomes large at a central part of the wall portion 28a constituting the upper surface, the polymer matrix layer 3 is preferably disposed to pass through the central part as in the present embodiment. For bonding the polymer matrix layer 3, an adhesive agent or an adhesive tape may be used in accordance with the needs.

Figure 2A:
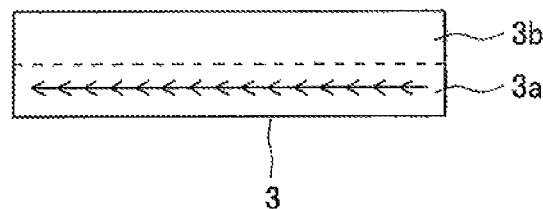
FIG. 2(a) and FIG. 2(b) are schematic views illustrating a structure of a polymer matrix layer in which a magnetic filler is unevenly distributed.
Figure 2B:
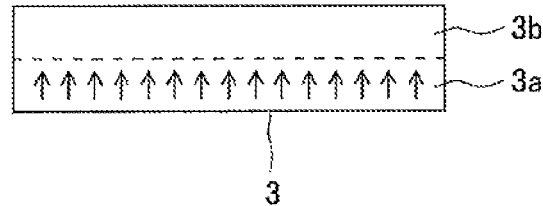

The polymer matrix layer 3 may be one in which the magnetic filler is uniformly dispersed. However, as shown in FIG. 2(a) and FIG. 2(b), the polymer matrix layer 3 is preferably one in which the magnetic filler is unevenly distributed in the thickness direction (up-and-down direction in FIG. 2(a) and FIG. 2(b)) of the polymer matrix layer 3. This polymer matrix layer 3 has a region 3a on one side containing a comparatively larger amount of the magnetic filler and a region. 3b on the other side containing a comparatively smaller amount of the magnetic filler. The arrows in the region 3a denote the magnetization direction (direction of magnetization) of the magnetic filler. In FIG. 2(a), the magnetic filler is magnetized in the in-plane direction (right-and-left direction in FIG. 2(a) and FIG. 2(b)) of the polymer matrix layer 3. In FIG. 2(b), the magnetic filler is magnetized in the thickness direction of the polymer matrix layer 3. In bonding the polymer matrix layer to an outer surface of the outer casing 21, the polymer matrix layer 3 is preferably attached to the outer casing 21 so as to let the region 3a face towards the outer casing 21. This increases the change in magnetism when the cell 2 swells, thereby raising the sensitivity.

In the above, the filler uneven distribution ratio in the region 3a on the one side preferably exceeds 50, and is more preferably 60 or more, still more preferably 70 or more. In this case, the filler uneven distribution ratio in the region 3b on the other side is less than 50. The filler uneven distribution ratio in the region 3a on the one side is 100 at the maximum, and the filler uneven distribution ratio in the region 3b on the other side is 0 at the minimum. For uneven distribution of the magnetic filler, it is possible to use a method in which, after the magnetic filler is introduced into the elastomer component, the resultant is left to stand still at room temperature or at a predetermined temperature, so as to attain natural settling of the magnetic filler by the weight of the magnetic filler. By changing the temperature or time for leaving the magnetic filler to stand still, the filler uneven distribution ratio can be adjusted. The magnetic filler may be distributed unevenly by using a physical force such as a centrifugal force or a magnetic force. Alternatively, the polymer matrix layer may be composed of a stacked body made of a plurality of layers having different contents of the magnetic filler.

The filler uneven distribution ratio is measured by the following method. That is, the cross-section of the polymer matrix layer is observed at a magnification of 100 times by using a scanning electron microscope-energy dispersive X-ray analyzer (SEM-EDS). The existence amount of the metal element inherent in the filler (for example, Fe element) is determined by element analysis for the whole region in the thickness direction of the cross-section and for each of the two regions obtained by equally dividing the cross-section into two in the thickness direction. With respect to this existence amount, the ratio of the existence amount in the region on the one side relative to the existence amount in the whole region in the thickness direction is calculated, and this is determined as the filler uneven distribution ratio in the region on the one side. The filler uneven distribution ratio in the region on the other side can be determined in the same manner.

The polymer matrix layer 3 may have a structure in which the region 3b that is located on the other side and that contains a relatively smaller amount of the magnetic filler is formed of a foamed body containing bubbles. This allows that the polymer matrix layer 3 can be more easily deformed, so that the sensor sensitivity is enhanced. Also, the region 3a as well as the region 3b may be formed of a foamed body. In this case, the whole of the polymer matrix layer 3 is made of a foamed body. The polymer matrix layer in which at least a part thereof in the thickness direction is made of a foamed body may be composed of a stacked body including a plurality of layers (for example, a non-foamed layer that contains a magnetic filler and a foamed layer that does not contain a magnetic filler).

A general resin foam can be used as the foamed body. However, in view of the characteristics such as compression set, it is preferable to use a thermosetting resin foam. Examples of the thermosetting resin foam include polyurethane resin foam and silicone resin foam. Among these, polyurethane resin foam is preferable. The isocyanate component and the compound containing active hydrogen that have been listed above can be used for the polyurethane resin foam. The polyurethane resin foam can be produced by an ordinary method of producing a polyurethane resin foam except that the magnetic filler is incorporated. The isocyanate component, the compound containing active hydrogen, and the catalyst that have been listed above can be used for the polyurethane resin foam.

As a foam stabilizer to be used in the polyurethane resin foam, it is possible to use a foam stabilizer that is used in producing an ordinary polyurethane resin foam, such as a silicone-based foam stabilizer or a fluorine-based foam stabilizer. A silicone-based surfactant or a fluorine-based surfactant that is used in the silicone-based foam stabilizer or fluorine-based foam stabilizer has a part that is soluble in polyurethane and a part that is insoluble in polyurethane in a molecule. Because the insoluble part disperses the polyurethane-based material uniformly to reduce the surface tension of the polyurethane-based material, the bubbles are more easily generated and are less likely to be broken. Of course, when the surface tension is lowered too much, the bubbles are less likely to be generated. When, for example, the silicone-based surfactant is used in the resin foam of the present invention, a dimethylpolysiloxane structure serving as the insoluble part makes it possible to reduce the bubble diameter or to increase the number of bubbles.

Commercially available products of the silicone-based foam stabilizers include "SF-2962," "SRX 274DL," "SF-2965," "SF-2904," "SF-2908," "SF-2904," and "L5340" manufactured by Dow Corning Toray Co., Ltd., and "TEGOSTAB B-8017," "B-8465," and "B-8443" manufactured by Evonik•Degussa AG. Also, commercially available products of the fluorine-based foam stabilizers include "FC430" and "FC4430" manufactured by 3M Company, and "FC142D," "F552," "F554," "F558," "F561," and "R41" manufactured by Dainippon Ink and Chemicals, Incorporated.

The amount of the foam stabilizer blended is preferably from 1 to 15 parts by mass, more preferably from 2 to 12 parts by mass, relative to 100 parts by mass of the resin component. When the amount of the foam stabilizer blended is less than 1 part by mass, the foaming is insufficient. When the amount of the foam stabilizer blended exceeds 10 parts by mass, there is a possibility of bleeding out.

The bubble content ratio of the foamed body is preferably from 20 to 80 vol %. When the bubble content ratio is 20 vol % or more, the polymer matrix layer 3 becomes flexible and can be easily deformed, whereby the sensor sensitivity can be enhanced successfully. Also, when the bubble content ratio is 80 vol % or less, the polymer matrix layer 3 is prevented from becoming brittle, so that the handling property and the stability of the sensor can be enhanced. The bubble content ratio can be determined by performing specific gravity measurement in accordance with JIS Z-8807-1976, and performing calculation based on the measured specific gravity value and the specific gravity value of a non-foamed body.

The average bubble diameter of the foamed body is preferably from 50 to 300 μm. Also, the average opening diameter of the foamed body thereof is preferably from 15 to 100 μm. When the average bubble diameter is less than 50 μm or when the average opening diameter is less than 15 μm, the stability of the sensor characteristics tends to be deteriorated due to increase in the amount of the foam stabilizer. Also, when the average bubble diameter exceeds 300 μm or when the average opening diameter exceeds 100 μm, the stability of the sensor characteristics tends to decrease due to variation in the bubble diameter. The average bubble diameter and the average opening diameter can be determined as follows. A cross-section of the polymer matrix layer is observed with a SEM at a magnification of 100 times. With respect to the obtained image, bubble diameters of all the bubbles and opening diameters of all the open-cell bubbles that are present in an arbitrary range of the cross-section are measured using image analyzing software. The average bubble diameter and the average opening diameter are calculated based on the average values of the measured values.

The polyurethane resin foam containing a magnetic filler can be produced by a production method including the following steps (i) to (v) is used, for example.

(i) Step of forming an isocyanate-group-containing urethane prepolymer from a polyisocyanate component and an active hydrogen component (ii) Primary stirring step of mixing and preliminarily stirring the isocyanate-group-containing urethane prepolymer, a foam stabilizer, a catalyst, and a magnetic filler, and vigorously stirring the mixture in a non-reactive gas atmosphere so as to incorporate bubbles into the mixture (iii) Step of further adding an active hydrogen component and performing secondary stirring to prepare a bubble dispersion urethane composition containing the magnetic filler (iv) Step of molding the bubble dispersion urethane composition into a desired shape and curing the composition to fabricate a urethane resin foam containing the magnetic filler (v) Step of magnetizing the urethane resin foam to form a magnetic urethane resin foam As a method for producing a polyurethane resin foam, a chemical foaming method using a reactive foaming agent such as water is known. However, it is preferable to use a mechanical foaming method of mechanically stirring the mixture under a non-reactive gas atmosphere as in the above step (ii). The mechanical foaming method facilitates the molding operation as compared with the chemical foaming method. Also, because water is not used as the foaming agent, a molded body having fine bubbles and being tough and excellent in repulsion elasticity (restorability) and the like can be obtained.

First, an isocyanate-group-containing urethane prepolymer is formed from a polyisocyanate component and an active hydrogen component, as described in the above step (i). Next, the isocyanate-group-containing urethane prepolymer, a foam stabilizer, a catalyst, and a magnetic filler are mixed and preliminarily stirred, and the mixture is vigorously stirred in a non-reactive gas atmosphere so as to incorporate bubbles into the mixture, as described in the above step (ii), and an active hydrogen component is further added and stirred to prepare a bubble dispersion urethane composition containing the magnetic filler, as described in the above step (iii). As described in the above steps (i) to (iii), in a polyurethane resin foam containing a polyisocyanate component, an active hydrogen component, and a catalyst, a method of forming the polyurethane resin foam after preliminarily forming an isocyanate-group-containing urethane prepolymer is known to those skilled in the art, and the production conditions can be suitably selected in accordance with the materials to be blended.

As the forming conditions in the above step (i), first, a blending ratio of the polyisocyanate component to the active hydrogen component is selected so that the ratio of the isocyanate group in the polyisocyanate component to the active hydrogen group in the active hydrogen component (isocyanate group/active hydrogen group) will be from 1.5 to 5, preferably from 1.7 to 2.3. Also, the reaction temperature is preferably from 60 to 120° C., and the reaction time is preferably from 3 to 8 hours. Further, a urethanization catalyst or an organic catalyst conventionally known in the art, for example, lead octylate commercially available under a trade name of "BTT-24" from Toei Chemical Industry Co., Ltd., "TEDA-L33" manufactured by Tosoh Corporation, "NIAX CATALYST A1" manufactured by Momentive Performance Materials Inc., "KAOLIZER NO. 1" manufactured by Kao Corporation, "DABCO T-9" manufactured by Air Products and Chemicals, Inc., or the like may be used. As an apparatus to be used in the above step (i), one capable of mixing and stirring the above materials and reacting the materials under the conditions as described above can be used, and an apparatus generally used for production of polyurethane can be used.

As a method for performing the preliminary stirring in the above step (ii), there can be mentioned a method of using a general mixer that can mix a liquid resin with a magnetic filler, and examples thereof include a homogenizer, a dissolver, and a planetary mixer.

By adding the foam stabilizer to the isocyanate-group-containing urethane prepolymer having a high viscosity and performing the stirring (primary stirring) in the above step (ii), and further adding the active hydrogen component and performing the secondary stirring in the above step (iii), the bubbles that have been incorporated into the reaction system become less likely to escape, so that an efficient foaming operation can be advantageously carried out.

The non-reactive gas in the above step (ii) is preferably a gas that is not combustible, and specific examples thereof include nitrogen, oxygen, carbon dioxide, rare gases such as helium and argon, and a mixed gas of these. Use of air that has been dried to remove moisture therefrom is the most preferable. Also, with respect to the conditions for the above primary stirring and secondary stirring, particularly for the primary stirring, conditions in producing a urethane foam by an ordinary mechanical foaming method can be used, so that the conditions are not particularly limited; however, vigorous stirring is carried out for 1 to 30 minutes at a rotation number of 1000 to 10000 rpm by using a stirring blade or a mixer having a stirring blade. Examples of such an apparatus include a homogenizer, a dissolver, and a mechanical froth foaming machine.

A method of molding the bubble dispersion urethane composition into a desired shape such as a sheet form in the above step (iv) is also not particularly limited. For example, it is possible to use a batch molding method in which the above mixture liquid is injected into a mold that has been subjected to a releasing treatment and cured, or a continuous molding method in which the above bubble dispersion urethane composition is continuously supplied onto a face material that has been subjected to a releasing treatment and cured. Also, the above curing conditions are not particularly limited, and curing at 60 to 200° C. for 10 minutes to 24 hours is preferable. When the curing temperature is too high, the resin foam is deteriorated by heat, thereby the mechanical strength is deteriorated. When the curing temperature is too low, the resin foam is insufficiently cured. Also, when the curing time is too long, the resin foam is deteriorated by heat, thereby the mechanical strength is deteriorated. When the curing time is too short, the resin foam is insufficiently cured.

Also, in the above step (iv), by providing a step of leaving the bubble dispersion urethane composition to stand still prior to curing, settling of the magnetic filler proceeds and floating-up of the bubbles proceeds in accordance with the period of time for leaving the filler to stand still. Therefore, by utilizing this phenomenon, a state can be obtained in which the magnetic filler is unevenly distributed in the thickness direction, and bubbles are present in a larger amount on the side that contains a relatively smaller amount of the magnetic filler.

The above step (v) can be carried out by using a general magnetizing apparatus, for example, "ES-10100-15SH" manufactured by Denshijiki Industry Co., Ltd., or "TM-YS4E" manufactured by Tamakawa Co., Ltd. Typically, a magnetic field of about 1 T to 8 T is applied, and the magnetization direction of the magnetic filler can be controlled in accordance with the direction of the applied magnetic field. The magnetic filler may be added, after magnetization, in the above step (ii) of forming the magnetic filler dispersion liquid. However, it is preferable to perform the magnetization in the above step (v) in view of the handling workability of the magnetic filler in the midway steps, for example.

The magnetism detection unit 4 detects a change in magnetism accompanying a deformation of the polymer matrix layer 3. The magnetism detection unit 4 is disposed outside the outer casing 21. An electric wiring for establishing electrical connection between the polymer matrix layer 3 and the magnetism detection unit 4 is not provided, so that the polymer matrix layer 3 and the magnetism detection unit 4 are in a non-connected state.

As the magnetism detection unit 4, a magnetic resistance element, a Hall element, an inductor, an MI element, a flux gate sensor, or the like can be used, for example. As the magnetic resistance element, a semiconductor compound magnetic resistance element, an anisotropic magnetic resistance element (AMR), a gigantic magnetic resistance element (GMR), and a tunnel magnetic resistance element (TMR) may be mentioned as examples. Among these, a Hall element is preferable. The Hall element has a comparatively wide sensitivity region, so that, by using this as the magnetism detection unit 4, high-sensitivity detection can be carried out in a wide range.

Only one cell 2 is shown in FIG. 1(*a*) and FIG. 1(*b*); however, a secondary battery 1 for use that requires a high voltage such as in a power source for the electrically driven vehicles is used in a mode of a battery module including a plurality of cells 2. In the battery module, the plurality of cells 2 constitutes an assembled battery and is accommodated in a case. Generally, the battery module mounted in vehicles is used in a mode of a battery pack. In the battery pack, a plurality of battery modules is connected in series and is accommodated in a case together with various apparatuses such as a controller. The case of the battery pack is formed to have a shape suitable for mounting in a vehicle, for example, a shape that conforms to the underfloor shape of the vehicle.

The magnetism detection unit 4 is preferably attached to a comparatively firm site that is hardly affected by the swelling of the cell 2. In the present embodiment, the magnetism detection unit 4 is attached to an inner surface of a case 11 of the battery module that faces the wall portion 28*a*. The case 11 of a battery module is formed, for example, of a metal or a plastic, and there may be cases in which a laminate film is used as the case 11 of the battery module. In the drawings, the magnetism detection unit 4 is disposed to be space apart from the polymer matrix layer 3; however, the magnetism detection unit 4 may be disposed to be in contact with the polymer matrix layer 3. The distance between the polymer matrix layer 3 and the magnetism detection unit 4 is not particularly limited as long as the magnetism detection unit 4 can detect a change in magnetism.

When the outer casing 21 swells to be deformed by rise in the internal pressure of the cell 2 due to change in volume of the active material accompanying the charging and discharging or due to decomposition of the electrolytic solution caused by overcharging, the polymer matrix layer 3 is deformed in accordance therewith, and a change in magnetism accompanying the deformation of the polymer matrix layer 3 is detected by the magnetism detection unit 4.

Detection signals that are output from the magnetism detection unit 4 are forwarded to a controlling apparatus not illustrated in the drawings, so that the inside state of the cell 2 is monitored over time. When change in the magnetic field larger than or equal to a set value is detected by the magnetism detection unit 4, a switching circuit that is not illustrated in the drawings and that is connected to the controlling apparatus shuts off the energization and stops the charging current or the discharging current, thereby preventing troubles such as rupture of the secondary battery 1.

This monitoring sensor makes use of a change in magnetism in detecting the deformation of the secondary battery 1, so that there is no need to provide an electric wiring from the polymer matrix layer 3 to the magnetism detection unit 4. Therefore, the sealed structure of the secondary battery 1 is not hindered by the monitoring sensor. Also, any one of the first to fourth modes described below is adopted with respect to the direction of magnetization of the magnetic filler contained in the polymer matrix layer 3 and the position of the magnetism detection unit 4 relative to the polymer matrix layer 3, whereby the deformation of the secondary battery 1 can be detected with a high degree of sensitivity.

[First Mode]

Figure 3:
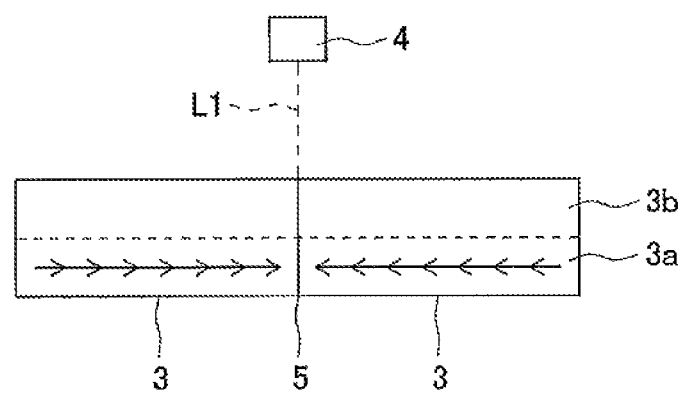
FIG. 3 is a schematic view illustrating one example of a monitoring sensor according to the first mode.

Referring to FIG. 3, in the first mode, the magnetic filler is magnetized in the in-plane direction of the polymer matrix layers 3. The direction of the arrows in the region 3*a* is perpendicular to the thickness direction of the polymer matrix layers 3. Also, in the first mode, an interface layer 5 is formed between the polymer matrix layers 3 that are arranged with edges thereof facing each other. At the interface layer 5, the edges of the polymer matrix layers 3 abut against each other, and these may not be bonded to each other. In the present embodiment, the interface layer 5 where the direction of magnetization changes extends in the thickness direction of the polymer matrix layers 3.

The directions of magnetization of the magnetic filler on one side and the other side having the interface layer 5 interposed therebetween are opposite to each other. In the present embodiment, each of the magnetization directions is directed towards the interface layer 5; however, these directions may be reversed. In other words, the positional relationship between an N-pole and an S-pole in the magnetic filler may be reversed from the one illustrated in the drawings. Also, the directions of magnetization of the magnetic filler on one side and the other side having the interface layer 5 interposed therebetween intersect with the interface layer 5 as viewed in the thickness direction of the polymer matrix layers 3. In other words, these magnetization directions are not parallel to the interface layer 5 but are at least oblique to the interface layer 5, more preferably perpendicular to the interface layer 5, as viewed in the thickness direction of the polymer matrix layers 3.

The magnetism detection unit 4 is disposed on a straight line L1 passing through the interface layer 5 and extending in the thickness direction of the polymer matrix layers 3. The magnetism detection unit 4 has a magnetism-sensitive surface, and a magnetic flux density that passes through this magnetism-sensitive surface is detected. The magnetism detection unit 4 is disposed so that the thickness direction of the polymer matrix layers 3 and the magnetism-sensitive surface thereof are perpendicular to each other. Also, the magnetism detection unit 4 is disposed so that the magnetism-sensitive surface passes through the straight line L1 and so that the magnetism-sensitive surface is perpendicular relative to the straight line L1.

Figure 4:
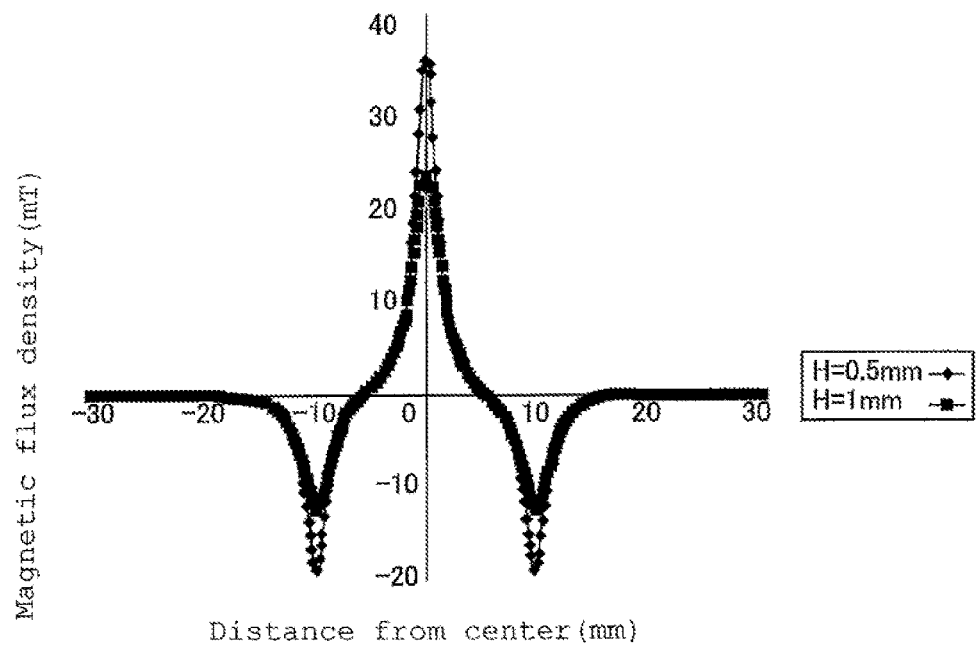
FIG. 4 is a graph showing a result of magnetic flux density measurement by the monitoring sensor of FIG. 3.
Figure 5:
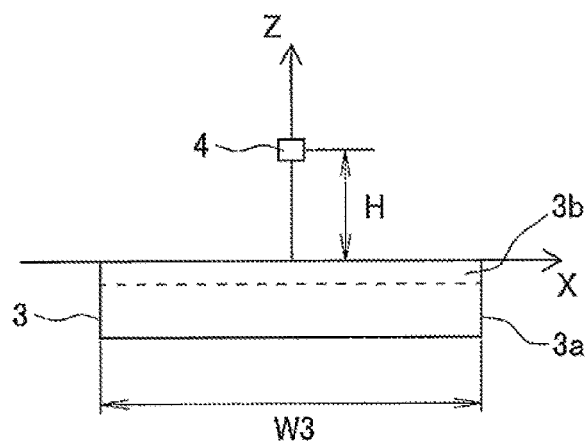
FIG. 5 is a view for describing a method for measuring the magnetic flux density.

FIG. 4 is a graph showing a result of magnetic flux density measurement by the monitoring sensor of FIG. 3. FIG. 5 is a view for describing a method for measuring the magnetic flux density. The lateral axis of the graph represents a distance in the in-plane direction of the polymer matrix layers 3, and corresponds to the X-axis in FIG. 5. The longitudinal axis of the graph represents the magnetic flux density, and whether the numerical value thereof is positive or negative is merely a difference of whether the input magnetic flux is an N-pole or an S-pole. The thickness of the polymer matrix layers 3 is 1 mm; the thickness of the region 3a within the polymer matrix layers 3 is 0.7 mm; and the thickness of the region 3b is 0.3 mm. By setting the height H of (the magnetism-sensitive surface of) the magnetism detection unit 4 to be 1 mm and 0.5 mm relative to the surface of the polymer matrix layers 3 used as a standard, the magnetic flux density in the in-plane direction of the polymer matrix layers 3 was measured in each case.

In the monitoring sensor of FIG. 3, two polymer matrix layers 3 each having a width of 10 mm are arranged, and a total width W3 (See FIG. 5) is 20 mm. The point of origin on the lateral axis of the graph of FIG. 4 is the center of the polymer matrix layers 3, and the interface layer 5 is located at this center. Positions located away from the point of origin by 10 mm to the right and left are edges of the polymer matrix layers 3. From FIG. 4, it will be understood that, in the polymer matrix layers 3 of FIG. 3, the absolute value of the magnetic flux density is the largest at the position of the interface layer 5 that is located on the straight line L1. This seems to be because a direction of leakage of the magnetic flux is controlled in a neighborhood of the interface layer 5, and the magnetic flux in the thickness direction of the polymer matrix layers 3 is amplified on the straight line L1.

In this manner, according to the first mode, the magnetism detection unit 4 is disposed at the position where the magnetic flux density is high (where the magnetic field is intense) for the polymer matrix layers 3 where the interface layer 5 such as shown in FIG. 3 is formed, so that the deformation of the secondary battery 1 can be detected with a high degree of sensitivity. Moreover, the first mode is particularly excellent in the effect of improving the sensitivity as compared with other modes (second to fourth modes) described later. Also, in the neighborhood of the interface layer 5, there is no site where the magnetic flux density locally becomes low, so that this is convenient for use in disposing the magnetism detection unit 4.

In the above, an example has been shown in which the edges of the polymer matrix layers 3 are made to abut against each other to form the interface layer 5; however, the present invention is not limited to this alone. For example, a different polymer matrix layer that does not contain a magnetic filler or is not magnetized may be interposed, or a gap may be provided, between the polymer matrix layers 3 that are arranged with edges thereof facing each other, thereby to form an interface layer. The width of the different polymer matrix layer or the gap such as these is set to be, for example, 0.1 mm to 10 mm.

[Second Mode]

Figure 6:
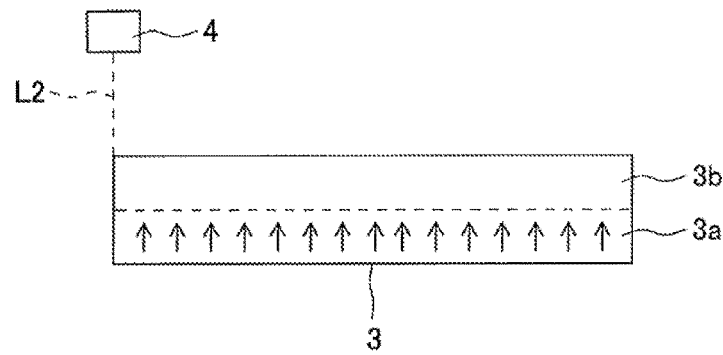
FIG. 6 is a schematic view illustrating one example of a monitoring sensor according to the second mode.

Referring to FIG. 6, in the second mode, the magnetic filler is magnetized in the thickness direction of the polymer matrix layers 3. The direction of the arrows in the region 3a is parallel to the thickness direction of the polymer matrix layers 3. In the present embodiment, the magnetization direction is directed upwards; however, this may be directed downwards as well. In other words, the positional relationship between the N-pole and the S-pole in the magnetic filler may be reversed from the one illustrated in the drawings. Unlike the other modes (first, third, and fourth modes), this polymer matrix layer 3 is not constructed by arranging polymer matrix layers with edges thereof facing each other, but can be regarded as a uniformly magnetized magnetic material having a flat plate shape.

The magnetism detection unit 4 is disposed on a straight line L2 passing through the edge of the polymer matrix layers 3 and extending in the thickness direction of the polymer matrix layers 3. The magnetism detection unit 4 has a magnetism-sensitive surface, and a magnetic flux density that passes through this magnetism-sensitive surface is detected. The magnetism detection unit 4 is disposed so that the thickness direction of the polymer matrix layers 3 and the magnetism-sensitive surface thereof are perpendicular to each other. Also, the magnetism detection unit 4 is disposed so that the magnetism-sensitive surface passes through the straight line L2 and so that the magnetism-sensitive surface is perpendicular relative to the straight line L2.

Figure 7:
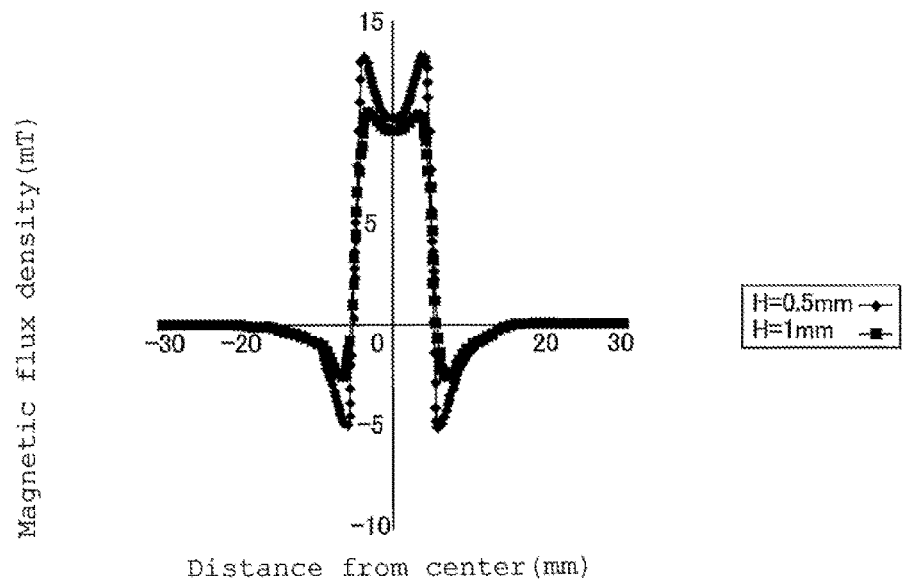
FIG. 7 is a graph showing a result of magnetic flux density measurement by the monitoring sensor of FIG. 6.

FIG. 7 is a graph showing a result of magnetic flux density measurement by the monitoring sensor of FIG. 6. The method for measuring the magnetic flux density and the thickness of the polymer matrix layer 3 are as described above, so that a duplicated description thereof will be omitted. In the monitoring sensor of FIG. 6, one sheet of the polymer matrix layer 3 having a width of 10 mm is used, and the total width W3 (See FIG. 5) is also 10 mm. The point of origin on the lateral axis of the graph of FIG. 7 is the center of the polymer matrix layer 3, and the positions located away from the point of origin by 5 mm to the right and left are edges of the polymer matrix layer 3.

From FIG. 7, it will be understood that, in the polymer matrix layer 3 of FIG. 6, the absolute value of the magnetic flux density is the largest in a neighborhood of the edges. This seems to be because the magnetic line is concentrated in the neighborhood of the straight line L2. In this manner, according to the second mode, the magnetism detection unit 4 is disposed at the position where the magnetic flux density is high (where the magnetic field is intense) for the polymer matrix layer 3 such as shown in FIG. 6, so that the deformation of the secondary battery 1 can be detected with a high degree of sensitivity.

The polarity is reversed at the position of the edge located on the straight line L2, so that the absolute value of the magnetic flux density is locally low. However, because the magnetism-sensitive surface has a size (width) of a certain degree, an effect of improving the sensitivity is obtained when the magnetism detection unit 4 is on the straight line L2. The center of the magnetism detection unit 4 (center of the magnetism-sensitive surface) may be located a little away from the straight line L2. In that case, the center of the magnetism detection unit 4 is disposed preferably within a region of 4.0 mm, more preferably 3.5 mm, and still more preferably 2.5 mm, from the straight line L2. Alternatively, the center of the magnetism detection unit 4 is disposed preferably within a region of 80%, more preferably 70%, and still more preferably 50%, of the half width (distance from the edge to the center) of the polymer matrix layer 3 from the straight line L2.

Figure 8:
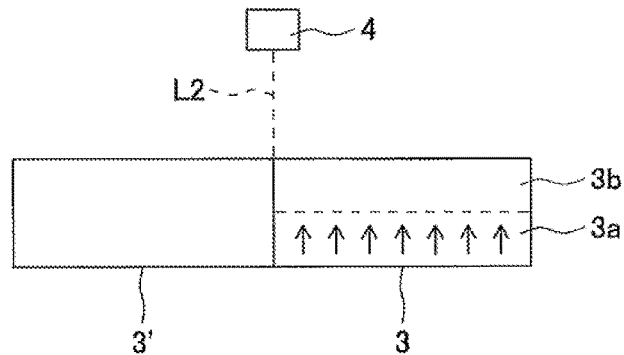
FIG. 8 is a schematic view illustrating another example of a monitoring sensor according to the second mode.

In an ordinary case, the edge of the polymer matrix layer 3 containing the magnetic filler corresponds to the surroundings of the polymer matrix layer 3. However, in the case in which the polymer matrix layer 3 is adjacent to a layer 3' that does not contain a magnetic filler as exemplified in FIG. 8, the interface thereof constitutes the edge of the polymer matrix layer 3 containing the magnetic filler. In this manner, the edge of the polymer matrix layer 3 can be treated as an edge of a region containing the magnetic filler.

[Third Mode]

Figure 9:
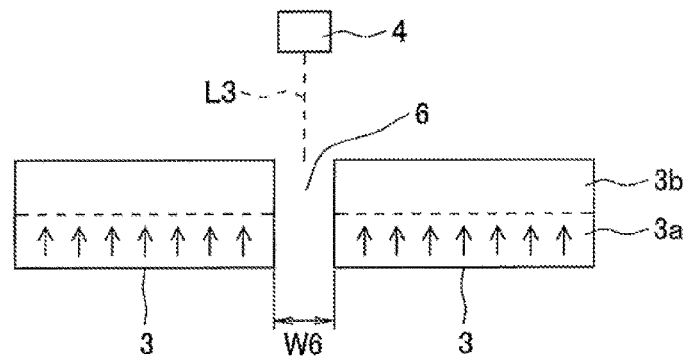
FIG. 9 is a schematic view illustrating one example of a monitoring sensor according to the third mode.

Referring to FIG. 9, in the third mode, the magnetic filler is magnetized in the thickness direction of the polymer matrix layers 3. The direction of the arrows in the region 3a is parallel to the thickness direction of the polymer matrix layers 3. Also, in the third mode, a gap 6 is provided between the polymer matrix layers 3 that are arranged with edges thereof facing each other. The width W6 of the gap 6 is set to be, for example, 0.1 mm to 10 mm. The directions of magnetization of the magnetic filler on one side and the other side having the gap 6 interposed therebetween are the same as each other. In the present embodiment, each of the magnetization directions is directed upwards; however, these may be directed downwards as well. In other words, the positional relationship between the N-pole and the S-pole in the magnetic filler may be reversed from the one illustrated in the drawings.

The magnetism detection unit 4 is disposed on a straight line L3 passing through the gap 6 and extending in the thickness direction of the polymer matrix layers 3. The position of the straight line L3 is not particularly limited as long as the straight line L3 is located in the gap 6; however, the straight line L3 is preferably located at the center of the gap 6 in view of enhancing the sensitivity. The magnetism detection unit 4 has a magnetism-sensitive surface, and a magnetic flux density that passes through this magnetism-sensitive surface is detected. The magnetism detection unit 4 is disposed so that the thickness direction of the polymer matrix layers 3 and the magnetism-sensitive surface thereof are perpendicular to each other. Also, the magnetism detection unit 4 is disposed so that the magnetism-sensitive surface passes through the straight line L3 and so that the magnetism-sensitive surface is perpendicular relative to the straight line L3.

Figure 10:
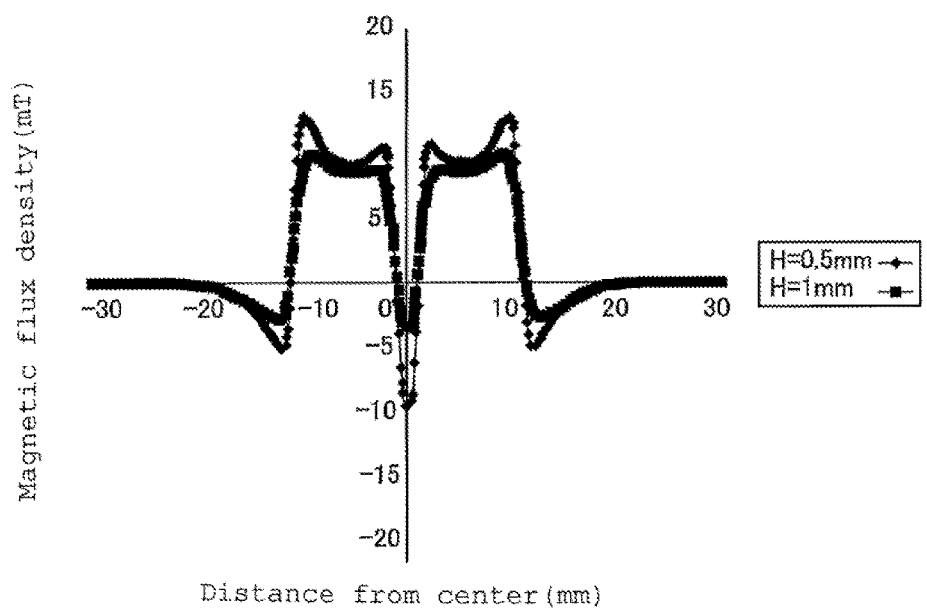
FIG. 10 is a graph showing a result f magnetic flux density measurement by the monitoring sensor of FIG. 9.

FIG. 10 is a graph showing a result of magnetic flux density measurement by the monitoring sensor of FIG. 9. The method for measuring the magnetic flux density and the thickness of the polymer matrix layer 3 are as described above, so that a duplicated description thereof will be omitted. In the monitoring sensor of FIG. 9, two polymer matrix layers 3 each having a width of 10 mm are arranged, and the width of the gap 6 is set to be 2 mm, so that the total width W3 (See FIG. 5) is 22 mm. The point of origin on the lateral axis of the graph of FIG. 10 is the center of the gap 6, and the positions located away from the point of origin by 11 mm to the right and left are edges of the polymer matrix layer 3.

From FIG. 10, it will be understood that, in the polymer matrix layers 3 of FIG. 9, the absolute value of the magnetic flux density is the largest at the position of the gap 6 that is located on the straight line L3. This seems to be because a direction of leakage of the magnetic flux is controlled in a neighborhood of the gap 6, and the magnetic flux in the thickness direction of the polymer matrix layers 3 is amplified on the straight line L3. In this manner, according to the third mode, the magnetism detection unit 4 is disposed at the position where the magnetic flux density is high (where the magnetic field is intense) for the polymer matrix layers 3 where the gap 6 such as shown in FIG. 9 is provided, so that the deformation of the secondary battery 1 can be detected with a high degree of sensitivity.

In the case in which the gap 6 is not provided in FIG. 9, the structure of the polymer matrix layers 3 thereof is substantially the same as that of FIG. 6, and a result of measurement of the magnetic flux density thereof shows the same tendency as that of FIG. 7. As shown in FIG. 7, the absolute value of the magnetic flux density is small at the center of the polymer matrix layers 3 such as this (corresponding to the point of origin of the lateral axis), so that a good sensitivity is hardly obtained. From this fact also, it will be understood that setting the gap 6 is effective.

In FIG. 9, an example has been shown in which two sheets of polymer matrix layers 3 are disposed in arrangement, and a gap 6 is provided therebetween; however, the present invention is not limited to this alone. For example, one sheet of a polymer matrix layer 3 may be disposed, and a gap 6 may be provided by drilling a hole therethrough. Even in such a case, a construction similar to that of FIG. 9 is formed, thereby realizing a structure in which the gap 6 is provided between the polymer matrix layers 3 that are arranged with edges thereof facing each other.

[Fourth Mode]

Figure 11:
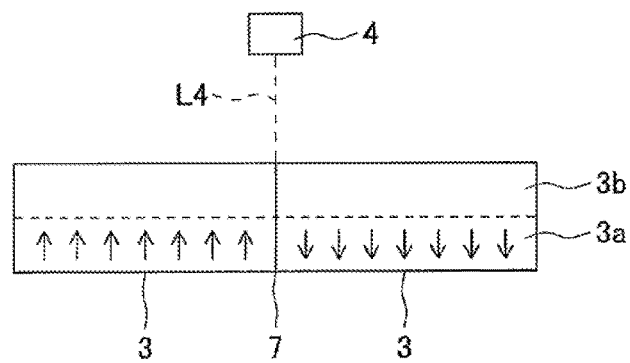
FIG. 11 is a schematic view illustrating one example of a monitoring sensor according to the fourth mode.

Referring to FIG. 11, in the fourth mode, the magnetic filler is magnetized in the thickness direction of the polymer matrix layers 3. The direction of the arrows in the region 3a is parallel to the thickness direction of the polymer matrix layers 3. Also, in the fourth mode, an interface layer 7 is provided between the polymer matrix layers 3 that are arranged with edges thereof facing each other. At the interface layer 7, the edges of the polymer matrix layers 3 abut against each other, and these may not be bonded to each other. In the present embodiment, the interface layer 7 where the direction of magnetization changes extends in the thickness direction of the polymer matrix layers 3. The directions of magnetization of the magnetic filler on one side and the other side having the interface layer 7 interposed therebetween are opposite to each other.

The magnetism detection unit 4 is disposed on a straight line L4 passing through the interface layer 7 and extending in the thickness direction of the polymer matrix layers 3. The magnetism detection unit 4 has a magnetism-sensitive surface, and a magnetic flux density that passes through this magnetism-sensitive surface is detected. The magnetism detection unit 4 is disposed so that the thickness direction of the polymer matrix layers 3 and the magnetism-sensitive surface thereof are perpendicular to each other. Also, the magnetism detection unit 4 is disposed so that the magnetism-sensitive surface passes through the straight line L4 and so that the magnetism-sensitive surface is perpendicular relative to the straight line L4.

Figure 12:
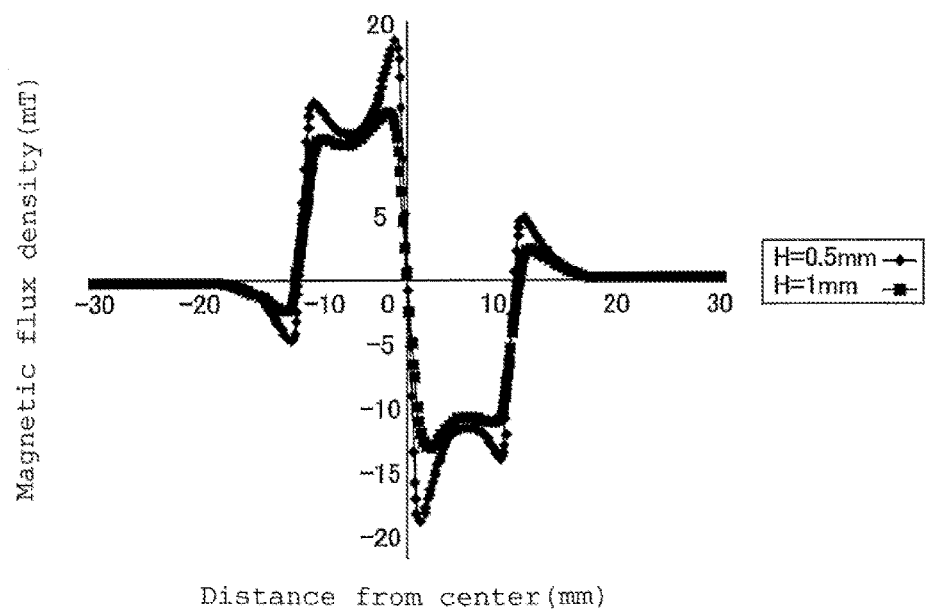
FIG. 12 is a graph showing a result of magnetic flux density measurement by the monitor sensor of FIG. 11.

FIG. 12 is a graph showing a result of magnetic flux density measurement by the monitoring sensor of FIG. 11. The method for measuring the magnetic flux density and the thickness of the polymer matrix layer 3 are as described above, so that a duplicated description thereof will be omitted. In the monitoring sensor of FIG. 11, two polymer matrix layers 3 each having a width of 10 mm are arranged, and a total width W3 (See FIG. 5) is 20 mm. The point of origin on the lateral axis of the graph of FIG. 12 is the center of the polymer matrix layers 3, and the interface layer 7 is located at this center. Positions located away from the point of origin by 10 mm to the right and left are edges of the polymer matrix layers 3.

Figure 13:
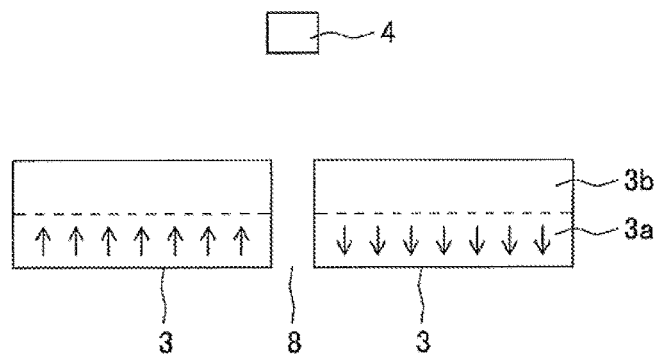
FIG. 13 is a schematic view of a monitoring sensor shown for comparison.
Figure 14:
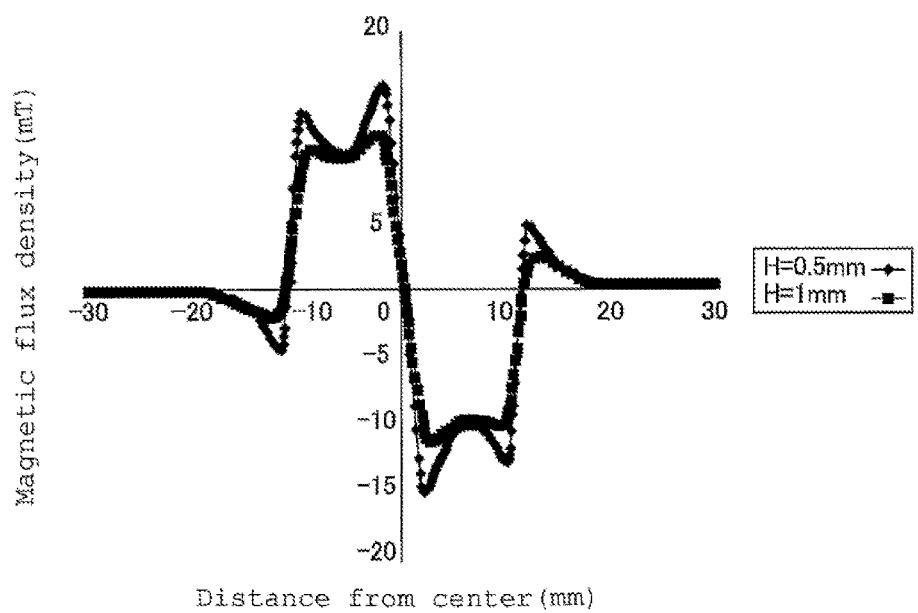
FIG. 14 is a graph showing a result of magnetic flux density measurement by the monitoring sensor of FIG. 13.

From FIG. 12, it will be understood that, in the polymer matrix layers 3 of FIG. 11, the absolute value of the magnetic flux density is the largest at the position of the interface layer 7 that is located on the straight line L4. This seems to be because the magnetic flux density is comparatively high in a neighborhood of each edge (See FIG. 7), and these magnetic flux densities are adjacent to each other while having opposite directions, so that the magnetic flux is locally amplified. In this manner, according to the fourth mode, the magnetism detection unit 4 is disposed at the position where the magnetic flux density is high (where the magnetic field is intense) for the polymer matrix layers 3 where the interface layer 7 such as shown in FIG. 11 is formed, so that the deformation of the secondary battery 1 can be detected with a high degree of sensitivity. In contrast, when a gap 8 is provided between the polymer matrix layers 3 as shown in FIG. 13, the phenomenon of amplification of the magnetic flux hardly appears as shown in FIG. 14, so that the effect of improving the sensitivity is not sufficiently obtained.

In the example of FIG. 12, the absolute value of the magnetic flux density is locally low at the position of the interface layer 7 located on the straight line L4 (corresponding to the point of origin on the lateral axis). However, because the magnetism-sensitive surface has a size (width) of a certain degree, an effect of improving the sensitivity is obtained when the magnetism detection unit 4 is on the straight line L4. The center of the magnetism detection unit 4 (center of the magnetism-sensitive surface) may be located a little away from the straight line L4. In that case, the center of the magnetism detection unit 4 is disposed preferably within a region of 4.0 mm, more preferably 3.5 mm, and still more preferably 2.5 mm, from the straight line L4. Alternatively, the center of the magnetism detection unit 4 is disposed preferably within a region of 80%, more preferably 70%, and still more preferably 50%, of the half width (distance from the edge to the center) of the polymer matrix layer 3 from the straight line L4.

The secondary battery 1 on which the monitoring sensor such as described above is mounted is not limited to a non-aqueous electrolyte secondary battery such as a lithium ion battery, and may be, for example, an aqueous electrolyte secondary battery such as a nickel hydrogen battery or a lead storage battery.

A method for monitoring the secondary battery 1 by using such a monitoring sensor is as already described. In other words, in the case in which the internal pressure of the cell 2 rises due to decomposition of the electrolytic solution caused by overcharging or the like, and the polymer matrix layer 3 is deformed in accordance therewith, a change in magnetism accompanying the deformation of the polymer matrix layer 3 is detected by the magnetism detection unit 4, and a deformation of the secondary battery 1 is detected on the basis thereof. This deformation of the secondary battery 1 is not limited to a deformation of the outer casing 21 of the cell 2, so that the deformation of the secondary battery 1 may be a deformation of the electrode group 22, as will be described later.

The present invention is not limited to the embodiment mentioned above, but can be improved and modified variously within the scope of the present invention. For example, in the above-described embodiments, the electrode group 22 has a winding structure; however, the electrode group 22 may have a lamination structure. The electrode group having a lamination structure is constructed by laminating a positive electrode and a negative electrode with a separator interposed therebetween. Also, for attaching the polymer matrix layer, other embodiments such as described below may be conceived. These can be applied without any particular limitation even when any one of the first to fourth modes described above is adopted.

Other Embodiments

In the above-described embodiments, an example has been shown in which the polymer matrix layer 3 is bonded to an outer surface of the outer casing 21; however, the polymer matrix layer 3 may be bonded to an inner surface of the outer casing 21. Such bonding is comparatively easy and can be easily stabilized, thereby being excellent in productivity and stability. Also, the polymer matrix layer 3 disposed in the inside of the outer casing 21 can be deformed comparatively easily in accordance with the rise in the internal pressure, so that a change in the internal pressure can be detected with a high degree of sensitivity. A construction in which the magnetic filler is unevenly distributed as described above allows that, by bonding the region 3*a* on one side containing a larger amount of the magnetic filler onto the inner surface of the outer casing 21, the change in magnetism occurring in response to the deformation of the polymer matrix layer 3 can be increased to enhance the sensitivity.

Figure 15:
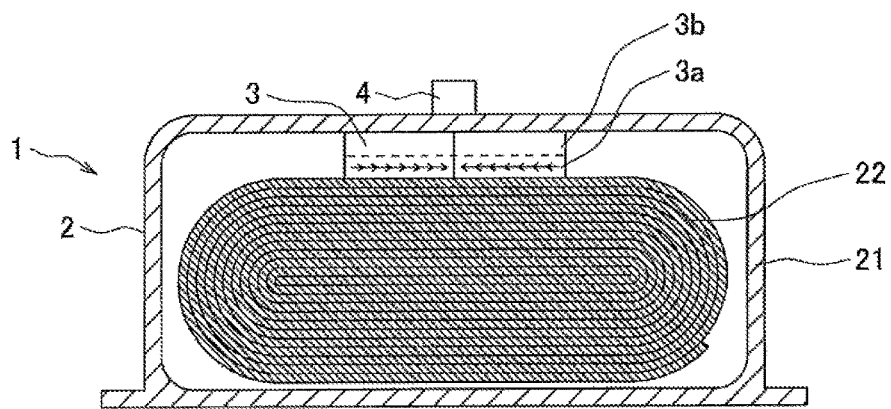
FIG. 15 is a sectional view illustrating another embodiment with respect to attachment of the polymer matrix layer.

Also, as exemplified in FIG. 15, the polymer matrix layer 3 may be attached to the electrode group 22. In this case, when the electrode group 22 is deformed due to a change in volume of the active material accompanying the charging and discharging, the polymer matrix layer 3 is deformed in accordance therewith, and a change in magnetism accompanying the deformation of the polymer matrix layer 3 is detected by the magnetism detection unit 4. A construction in which the magnetic filler is unevenly distributed as described above allows that, by bonding the region 3*a* on one side containing a larger amount of the magnetic filler onto the surface of the electrode group 22, the change in magnetism occurring in response to the deformation of the polymer matrix layer 3 can be increased to enhance the sensitivity.

Figure 16:
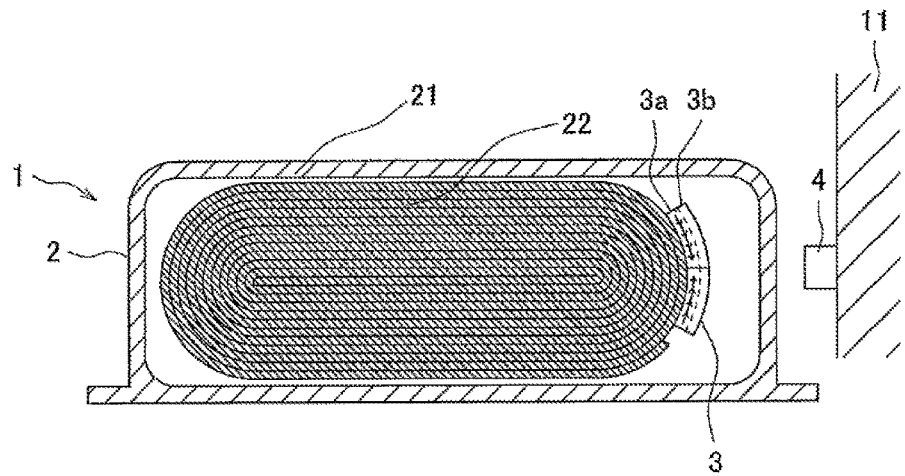
FIG. 16 is a sectional view illustrating another embodiment with respect to attachment of the polymer matrix layer.

The present invention is not limited to a construction in which the polymer matrix layer 3 is mounted on a flat surface, so that the polymer matrix layer 3 may be mounted on a curved surface as shown in FIG. 16. In this example, the polymer matrix layer 3 is mounted on a curved surface of the electrode group 22. Alternatively, however, the polymer matrix layer 3 may be mounted on a curved surface of the outer casing 21. As shown in FIGS. 15 and 16, the polymer matrix layer 3 bonded to the electrode group 22 having a winding structure may be used as a tape for fixing an edge part of the electrode group 22. Also, the polymer matrix layer 3 disposed in the inside of the outer casing 21 is preferably covered with a protective film (not illustrated in the drawings) for preventing elution into the electrolytic solution from the viewpoint of ensuring a good sensor sensitivity.

DESCRIPTION OF REFERENCE SIGNS

1 Sealed secondary battery
2 Cell
3 Polymer matrix layer
3*a* Region on one side
3*b* Region on the other side
4 Magnetism detection unit
5 Interface layer
6 Gap
7 Interface layer
21 Outer casing
22 Electrode group

The invention claimed is:

1. A monitoring sensor for monitoring a sealed secondary battery in which an electrode group is accommodated in an inside of a sealed outer casing,
the monitoring sensor comprising:
polymer matrix layers containing a magnetic filler and attached to the outer casing or the electrode group, and a magnetism detection unit for detecting a change in magnetism accompanying a deformation of the polymer matrix layers, wherein the magnetic filler is magnetized in an in-plane direction of the polymer matrix layers, the magnetic filler is unevenly distributed in a thickness direction of the polymer matrix layers, and the polymer matrix layers have a region on one side containing a comparatively larger amount of the magnetic filler and a region on an other side containing a comparatively smaller amount of the magnetic filler, an interface layer is formed between the polymer matrix layers that are arranged with edges thereof facing each other, directions of magnetization of the magnetic filler on one side and the other side having the interface layer interposed therebetween are opposite to each other and intersect with the interface layer as viewed in a thickness direction of the polymer matrix layers, and the magnetism detection unit is disposed on a straight line passing through the interface layer and extending in the thickness direction of the polymer matrix layers.

2. A sealed secondary battery in which a monitoring sensor according to claim 1 is mounted.

3. A method for monitoring a sealed secondary battery, comprising:

detecting, by using a monitoring sensor according to claim 1, a change in magnetism accompanying a deformation of the polymer matrix layer with the magnetism detection unit, and detecting a deformation of the sealed secondary battery on a basis thereof.

4. A monitoring sensor for monitoring a sealed secondary battery in which an electrode group is accommodated in an inside of a sealed outer casing, the monitoring sensor comprising:

a polymer matrix layer containing a magnetic filler and attached to the outer casing or the electrode group, and a magnetism detection unit for detecting a change in magnetism accompanying a deformation of the polymer matrix layer, wherein the magnetic filler is magnetized in a thickness direction of the polymer matrix layer, and the magnetism detection unit is disposed on a straight line passing through an edge of the polymer matrix layer and extending in the thickness direction of the polymer matrix layer.

5. A sealed secondary battery in which a monitoring sensor according to claim 4 is mounted.

6. A method for monitoring a sealed secondary battery, comprising:

detecting, by using a monitoring sensor according to claim 4, a change in magnetism accompanying a deformation of the polymer matrix layer with the magnetism detection unit, and detecting a deformation of the sealed secondary battery on a basis thereof.

7. A monitoring sensor for monitoring a sealed secondary battery in which an electrode group is accommodated in an inside of a sealed outer casing, the monitoring sensor comprising:

polymer matrix layers containing a magnetic filler and attached to the outer casing or the electrode group, and a magnetism detection unit for detecting a change in magnetism accompanying a deformation of the polymer matrix layers, wherein the magnetic filler is magnetized in a thickness direction of the polymer matrix layers, a gap is disposed between the polymer matrix layers that are arranged with edges thereof facing each other, directions of magnetization of the magnetic filler on one side and the other side having the gap interposed therebetween are the same as each other, and the magnetism detection unit is disposed on a straight line passing through the gap and extending in the thickness direction of the polymer matrix layers.

8. A sealed secondary battery in which a monitoring sensor according to claim 7 is mounted.

9. A method for monitoring a sealed secondary battery, comprising:

detecting, by using a monitoring sensor according to claim 7 a change in magnetism accompanying a deformation of the polymer matrix layer with the magnetism detection unit, and detecting a deformation of the sealed secondary battery on a basis thereof.

* * * * *